(12) United States Patent (10) Patent No.: US 8,854,600 B2
Mizumura (45) Date of Patent: Oct. 7, 2014

(54) EXPOSURE APPARATUS AND PHOTOMASK

(75) Inventor: Michinobu Mizumura, Yokohama (JP)

(73) Assignee: V Technology Co., Ltd., Yokohama-shi (JP)

( * ) Notice: Subject to any disclaimer, the term of this patent is extended or adjusted under 35 U.S.C. 154(b) by 839 days.

(21) Appl. No.: 13/091,774

(22) Filed: Apr. 21, 2011

(65) Prior Publication Data

US 2011/0194095 A1   Aug. 11, 2011

Related U.S. Application Data

(63) Continuation of application No. PCT/JP2009/068165, filed on Oct. 22, 2009.

(30) Foreign Application Priority Data

Oct. 24, 2008   (JP) ................................ 2008-273863

(51) Int. Cl.
  *G03F 1/00*   (2012.01)
  *G03F 7/20*   (2006.01)
  *G03F 1/38*   (2012.01)

(52) U.S. Cl.
  CPC ............. *G03F 7/70791* (2013.01); *G03F 1/14* (2013.01); *G03F 7/70283* (2013.01); *G03F 1/38* (2013.01)
  USPC ............................................. 355/53; 355/74

(58) Field of Classification Search
  USPC ............................ 355/53, 74; 430/5; 359/618
  See application file for complete search history.

(56) References Cited

U.S. PATENT DOCUMENTS

2007/0242363 A1 * 10/2007 Noboru et al. ................ 359/618

FOREIGN PATENT DOCUMENTS

| JP | 03-020733 | 1/1991 |
|---|---|---|
| JP | 06-148861 | 5/1994 |
| JP | 08-008164 | 1/1996 |
| JP | 11-111601 | 4/1999 |
| JP | 2001-176773 | 6/2001 |
| JP | 2006-003419 | 1/2006 |
| JP | 2008-076709 | 4/2008 |

OTHER PUBLICATIONS

International Preliminary Report on Patentability in PCT/JP2009/068165; Mailing Date: Jun. 16, 2011.
Japanese Office Action mailed Jun. 11, 2013 in Application No. 2008-273863.
Chinese Office Action dated Feb. 21, 2013 in corresponding Chinese Application No. 200980142622.5.

* cited by examiner

*Primary Examiner* — Peter B Kim
(74) *Attorney, Agent, or Firm* — Finnegan, Henderson, Farabow, Garrett & Dunner, L.L.P.

(57) ABSTRACT

The present invention provides an exposure apparatus for intermittently irradiating light from a light source to a TFT substrate through a photomask while conveying the TFT substrate in one direction, and forming an exposure pattern on the TFT substrate corresponding to a plurality of mask patterns formed on the photomask. On one surface of the photomask, electrode wiring patterns and signal wiring patterns requiring different resolutions are formed and an electrode wiring pattern group including a plurality of electrode wiring patterns and a signal wiring pattern group including a plurality of signal wiring patterns are formed in front and back in the conveying direction of the TFT substrate, and on the other surface of the photomask, micro-lenses which reduce and project the electrode wiring patterns requiring a high resolution onto the TFT substrate are formed. The photomask is disposed so that the micro-lenses face the TFT substrate.

5 Claims, 6 Drawing Sheets

EXPOSURE APPARATUS AND PHOTOMASK

This application is a continuation of PCT/JP2009/068165, filed on Oct. 22, 2009.

BACKGROUND OF THE INVENTION

1. Field of the Invention

The present invention relates to an exposure apparatus for intermittently irradiating exposure light from a light source to a subject to be exposed while conveying the subject to be exposed in one direction and forming an exposure pattern, in particular, relates to an exposure apparatus and a photomask for forming two types of exposure patterns requiring different resolutions at the same time in the same exposure process to enhance the efficiency of exposure processing.

2. Description of Related Art

A conventional exposure apparatus intermittently irradiates exposure light to a subject to be exposed which is being conveyed at a constant speed and exposes a mask pattern of a photomask to a predetermined position. The conventional exposure apparatus captures an image of a position on the upstream side of an exposure position of the photomask in the conveying direction of the subject to be exposed by an imaging device, achieves alignment of the subject to be exposed with the photomask on the basis of the captured image, and controls irradiating timing of the exposure light (for example, see Japanese Laid-Open (Kokai) Patent Application Publication No. 2008-76709).

However, such a conventional exposure apparatus transfers a mask pattern formed on the photomask to the subject to be exposed without change by the exposure light vertically passing through the photomask. Therefore, the pattern on the subject to be exposed blurs and the resolution decreases by the presence of a viewing angle (collimation half angle) of light from a light source irradiated to the photomask, so that there is a possibility that a fine pattern is not formed by the exposure. Therefore, two types of patterns requiring different resolutions are not formed at the same time in the same exposure process.

Although it is possible to solve such a problem by dividing the exposure process into two processes in which a fine pattern requiring a high resolution is formed by using, for example, a reduced projection exposure apparatus having a high resolution and a pattern requiring a low resolution is formed by using the above exposure apparatus, there is a problem that the efficiency of exposure processing is low.

It is possible to use the reduced projection exposure apparatus and form two types of exposure patterns requiring different resolutions at the same time in a state in which both exposure patterns have a high resolution. However, in this case, multiple surfaces are exposed while the subject to be exposed is moved step by step in a two-dimensional plane. Therefore, there is a problem that the efficiency of exposure processing is extremely low, in particular, for a subject to be exposed having a large size.

SUMMARY OF THE INVENTION

Therefore, in view of the above-mentioned problems, the present invention has an object to provide an exposure apparatus and a photomask for forming two types of exposure patterns requiring different resolutions at the same time in the same exposure process in order to enhance the efficiency of exposure processing.

In order to achieve the above-mentioned object, the exposure apparatus according to the present invention is an exposure apparatus for intermittently irradiating light from a light source to a subject to be exposed through a photomask while conveying the subject to be exposed in one direction, and forming an exposure pattern on the subject to be exposed corresponding to a plurality of mask patterns formed on the photomask, and in the photomask, two mask pattern groups formed by two types of mask patterns requiring different resolutions are formed on a light shielding film formed on one surface of a transparent substrate in front and back of the conveying direction of the subject to be exposed and micro-lenses which reduce and project one mask pattern requiring a high resolution among the two types of mask patterns requiring different resolutions onto the subject to be exposed are formed on the other surface of the transparent substrate in a position corresponding to the one mask pattern requiring a high resolution, and the photomask is disposed so that the micro-lenses face the subject to be exposed.

By such a configuration, the exposure apparatus intermittently irradiates light from a light source to the light shielding film formed on one surface of the transparent substrate of the subject to be exposed through the photomask in which two mask pattern groups formed by two types of mask patterns requiring different resolutions are formed in front and back of the conveying direction of the subject to be exposed while conveying the subject to be exposed in one direction, and, by using micro-lenses formed on the other surface of the transparent substrate corresponding to one mask pattern requiring a high resolution among the two types of mask patterns requiring different resolutions, reduces and projects the one mask pattern onto the subject to be exposed to form an exposure pattern corresponding to the one mask pattern, and then forms an exposure pattern corresponding to the other mask pattern requiring a low resolution among the two types of mask patterns requiring different resolutions on the subject to be exposed.

The mask pattern group formed by one mask pattern requiring a high resolution includes a plurality of mask pattern columns formed by arranging the plurality of the mask patterns at a predetermined pitch in a direction substantially perpendicular to the conveying direction of the subject to be exposed. The mask pattern group is formed by shifting mask pattern columns following a mask pattern column located at the most downstream side in the conveying direction of the subject to be exposed by a predetermined length respectively in the arrangement direction of the plurality of mask patterns so that intervals between a plurality of exposure patterns formed by the mask pattern column located at the most downstream side can be interpolated by a plurality of exposure patterns formed by the mask pattern columns following the mask pattern column located at the most downstream side. In this way, a plurality of mask pattern columns formed by arranging a plurality of the mask patterns at a predetermined pitch in a direction substantially perpendicular to the conveying direction of the subject to be exposed are provided, and by the mask pattern group which is formed by the one mask pattern requiring a high resolution and which is formed by, with respect to a mask pattern column located at the most downstream side in the conveying direction of the subject to be exposed, shifting mask pattern columns following the mask pattern column located at the most downstream side by a predetermined length respectively in the arrangement direction of a plurality of mask patterns, intervals between a plurality of exposure patterns formed by the mask pattern column located at the most downstream side are interpolated by a plurality of exposure patterns formed by the mask pattern columns following the mask pattern column located at the most downstream side.

The subject to be exposed is a TFT substrate of a liquid crystal display apparatus. Among the two types of mask patterns requiring different resolutions, the one mask pattern is an electrode wiring pattern of a thin film transistor, and the other mask pattern is a signal wiring pattern for providing a signal to the thin film transistor, and the electrode wiring pattern and the signal wiring pattern are formed so that an exposure pattern of the electrode wiring pattern and an exposure pattern of the signal wiring pattern are connected to each other. Based on this, an electrode wiring pattern of a thin film transistor is reduced and projected to a TFT substrate of a liquid crystal display apparatus and an exposure pattern corresponding to the electrode wiring pattern is formed, an exposure pattern corresponding to a signal wiring pattern for providing a signal to the thin film transistor is formed, and both exposure patterns are connected to each other on the TFT substrate.

In the photomask according to the present invention, two mask pattern groups formed by two types of mask patterns requiring different resolutions are formed abreast on a light shielding film formed on one surface of a transparent substrate and micro-lenses that reduce and project one mask pattern requiring a high resolution among the two types of mask patterns requiring different resolutions onto a subject to be exposed which is disposed to face the micro-lenses are formed on the other surface of the transparent substrate in a position corresponding to the one mask pattern requiring a high resolution.

By such a configuration, on the subject to be exposed which is disposed to face the micro-lenses formed on the other surface of the transparent substrate corresponding to one mask pattern requiring a high resolution among the two types of mask patterns requiring different resolutions which forms two mask pattern groups formed abreast on the light shielding film formed on one surface of the transparent substrate, respectively, the one mask pattern is reduced and projected and the other mask pattern requiring a low resolution is transferred without change.

The mask pattern group formed by one mask pattern requiring a high resolution includes a plurality of mask pattern columns which is formed by linearly arranging the plurality of the mask patterns at a predetermined pitch, and which is formed by, with respect to an arbitrary mask pattern column, shifting the other mask pattern columns by a predetermined length respectively in the arrangement direction of the plurality of the mask patterns. Based on this, on the subject to be exposed that is conveyed in a direction substantially perpendicular to the mask pattern columns, intervals between a plurality of exposure patterns formed by an arbitrary mask pattern column are interpolated by a plurality of exposure patterns formed by the other mask pattern columns.

According to a first aspect of the present invention, one mask pattern requiring a high resolution among the two types of mask patterns requiring different resolutions formed on the same photomask is reduced and projected by a micro-lens to form a fine exposure pattern having a high resolution, and the other mask pattern requiring a low resolution is transferred without change, so that a large exposure pattern covering a wide area can be formed. Therefore, even when two types of exposure patterns requiring different resolutions are formed on the subject to be exposed in a state in which both exposure patterns are mixed, the exposure patterns can be formed at the same time in the same exposure process, so that the efficiency of the exposure processing can be improved.

According to a second aspect of the present invention, even when the arrangement pitch of a plurality of mask patterns in a mask pattern column cannot be reduced due to the presence of the micro-lenses, intervals between a plurality of exposure patterns formed by a mask pattern column located at the most downstream side in the conveying direction of the subject to be exposed can be interpolated by a plurality of exposure patterns formed by mask pattern columns following the mask pattern column located at the most downstream side. Therefore, exposure patterns requiring a high resolution can be densely formed.

According to a third aspect of the present invention, on a TFT substrate of a liquid crystal display apparatus, exposure patterns of electrode wiring patterns of thin film transistor which require a high resolution and exposure patterns of signal wiring patterns whose resolution may be low can be formed in the same exposure process in a state in which both exposure patterns are connected to each other. Therefore, wiring patterns of the TFT substrate can be efficiently formed.

According to a fourth aspect of the present invention, one mask pattern requiring a high resolution among the two types of mask patterns requiring different resolutions formed on the same transparent substrate is reduced and projected by a micro-lens to form a fine exposure pattern having a high resolution, and the other mask pattern requiring a low resolution is transferred without change, so that a large exposure pattern covering a wide area can be formed. Therefore, even when two types of exposure patterns requiring different resolutions are formed on the subject to be exposed in a state in which both exposure patterns are mixed, the exposure patterns can be formed at the same time in the same exposure process, so that the efficiency of the exposure processing can be enhanced.

According to a fifth aspect of the present invention, even when the arrangement pitch of a plurality of mask patterns in a mask pattern column cannot be reduced due to the presence of the micro-lenses, on the subject to be exposed conveyed in a direction substantially perpendicular to the mask pattern column, intervals between a plurality of exposure patterns formed by an arbitrary mask pattern column can be interpolated by a plurality of exposure patterns formed by the other mask pattern columns. Therefore, exposure patterns requiring a high resolution can be densely formed.

BRIEF DESCRIPTION OF THE DRAWINGS

FIG. 2A is a plan view, FIG. 2B is a side view, and FIG. 2C is a bottom view;

DESCRIPTION OF THE PREFERRED EMBODIMENTS

Figure 1:
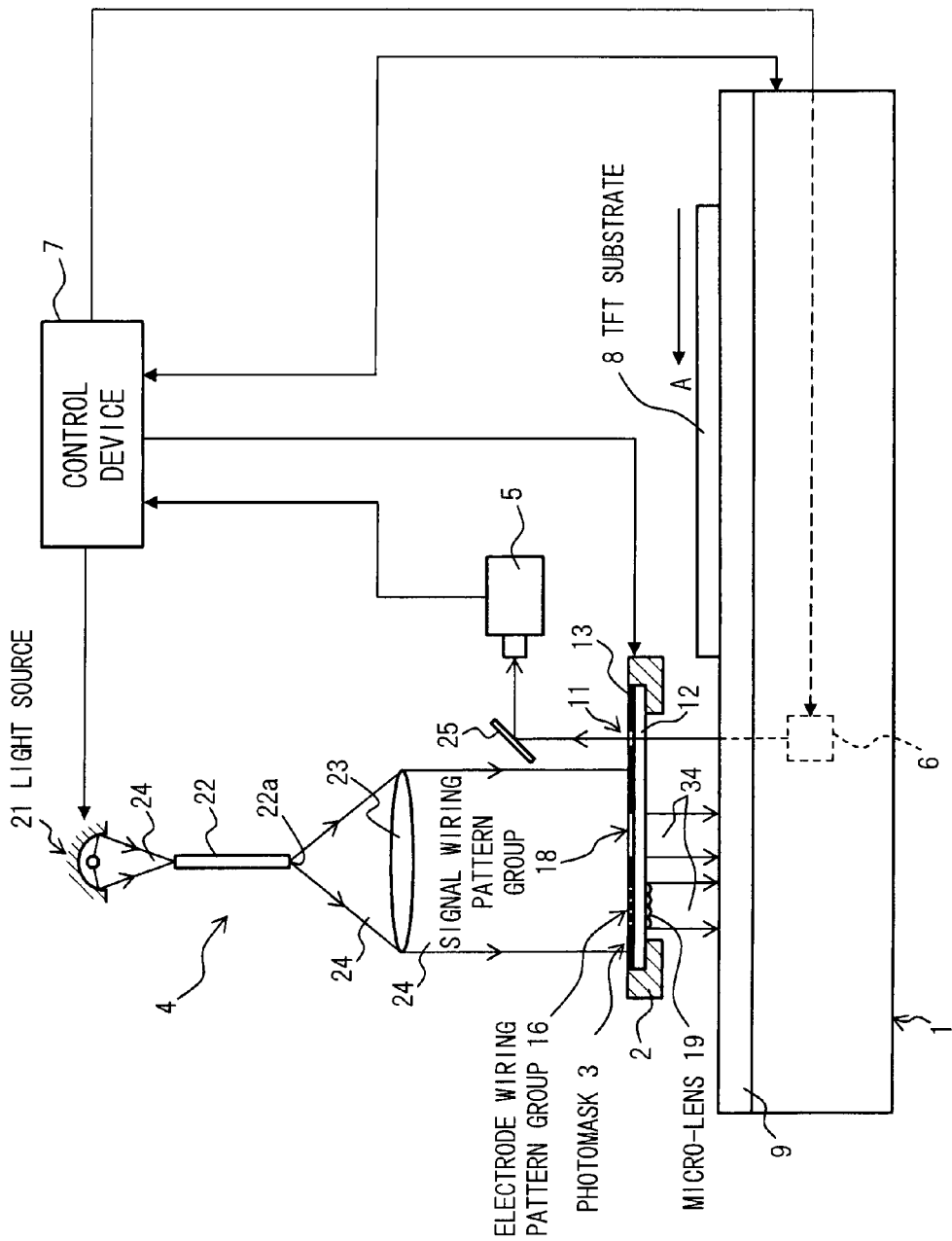
FIG. 1 is a schematic configuration view illustrating an embodiment of an exposure apparatus according to the present invention.

Hereinafter, an embodiment of the present invention will be described in detail with reference to the attached drawings. FIG. 1 is a schematic configuration view illustrating an embodiment of an exposure apparatus according to the present invention. The exposure apparatus intermittently irradiates light from a light source to a subject to be exposed while conveying the subject to be exposed in one direction and forms an exposure pattern. The exposure apparatus includes a conveying device 1, a mask stage 2, a photomask 3, an exposure optical system 4, an imaging device 5, an illumination device 6, and a control device 7. The subject to be exposed is a TFT substrate 8 which is used for a liquid crystal display apparatus and in which an electrode wiring pattern of a thin film transistor, for example, an electrode wiring pattern including gate, drain, and source electrodes and wirings connecting to these electrodes is repeatedly formed at a predetermined interval and a signal wiring pattern providing signals to the thin film transistors are formed on one surface of a transparent substrate.

The conveying device 1 conveys the stage 9 with the TFT substrate 8 coated with a photosensitive resin mounted thereon at a predetermined speed in one direction (direction indicated by an arrow A), and for example, moves the stage 9 by a moving mechanism configured by combining a motor, a gear, and the like. The conveying device 1 is provided with a speed sensor (not shown in FIG. 1) for detecting a moving speed of the stage 9 and a position sensor (not shown in FIG. 1) for detecting a moving distance of the stage 9.

Figure 2:
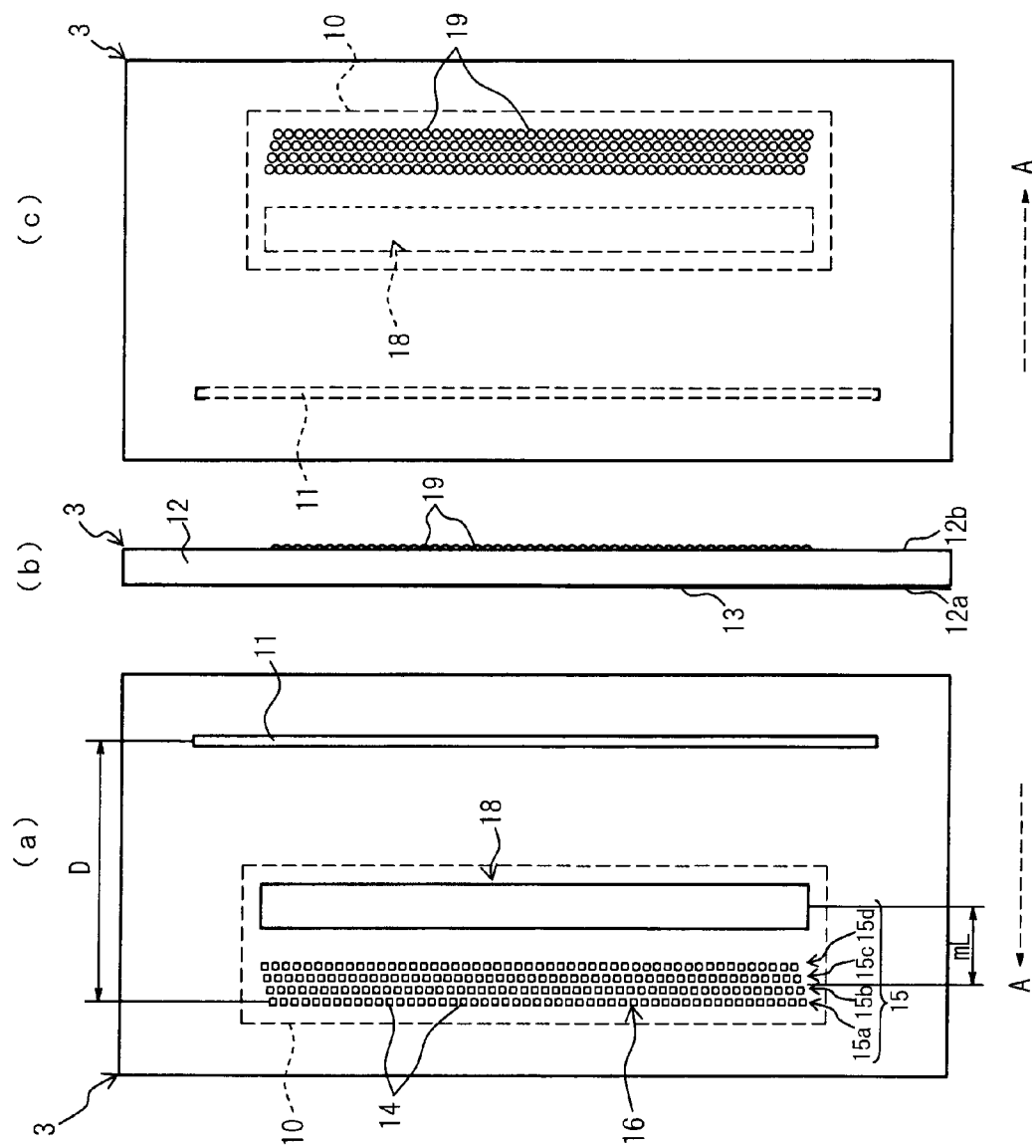
FIGS. 2A to 2C are view illustrating a configuration of a photomask used for the exposure apparatus of the present invention.

The mask stage 2 is provided in an upper portion of the conveying device 1. The mask stage 2 holds the photomask 3 described below proximately facing the TFT substrate 8 mounted and conveyed on the conveying device 1. The mask stage 2 has an opening in a center portion thereof corresponding to an area including a mask pattern forming area 10 and an observation window 11 (see FIG. 2) in the photomask 3, to thereby hold the photomask 3 by positioning peripheral portions of the photomask 3. The mask stage 2 is formed to be able to move integrally together with the imaging means 5 described below in a direction substantially perpendicular to the conveying direction indicated by the arrow A of the TFT substrate 8 in a plane in parallel with the surface of the stage 9. The mask stage 2 may be formed to be able to rotate around the center of the mask stage 2 as an axis within a range of a predetermined angle as needed.

The photomask 3 is attachably and detachably held by the mask stage 2. In the photomask 3, two mask pattern groups formed by two types of mask patterns requiring different resolutions are formed on a light shielding film formed on one surface of a transparent substrate in sequence in the conveying direction of the TFT substrate 8, and micro-lenses which reduce and project one mask pattern requiring a high resolution among the two types of mask patterns on the TFT substrate 8 are formed on the other surface of the transparent substrate in a position corresponding to the one mask pattern requiring a high resolution. The photomask 3 is held by the mask stage 2 so that the micro-lenses face the TFT substrate 8.

Specifically, in the photomask 3, as illustrated in FIG. 2B, for example, an opaque chrome (Cr) film 13 which is a light shielding film is formed on one surface 12a of a transparent substrate 12 made of a quartz glass, and on the chrome (Cr) film 13, a plurality of electrode wiring patterns 14 (see FIG. 3) of thin film transistors which have a high required resolution and an opening pattern of a predetermined shape are linearly arranged in a direction substantially perpendicular to the conveying direction (direction indicated by the arrow A) of the TFT substrate 8 at a predetermined pitch to form an electrode column pattern 15 in the pattern forming area 10 indicated by a dashed line in FIG. 2A, and an electrode wiring pattern group 16 is formed by a plurality of electrode wiring pattern columns 15. On the other hand, a signal wiring pattern group 18 including a plurality of signal wiring patterns 17 (see FIG. 4) having a low required resolution which are connected to exposure patterns formed on the TFT substrate 8 corresponding to the electrode wiring patterns 14 and provide signals to the thin film transistors is formed on one side of the electrode wiring pattern group 16 in the pattern forming area 10. In FIG. 2A, in order to prevent the drawing from being complicated, the electrode wiring pattern 14 and the signal wiring pattern 17 are indicated by a rectangle for simplicity. On the other surface 12b of the transparent substrate 12, as illustrated in FIG. 2C, a plurality of micro-lenses 19 are formed corresponding to the plurality of electrode wiring patterns 14. Electrode wiring pattern columns 15b to 15d following an electrode wiring pattern column 15a located at the most downstream side in the conveying direction of the TFT substrate 8 are formed by being shifted by a predetermined length respectively in the arrangement direction of the plurality of electrode wiring patterns 14 so that intervals between a plurality of exposure patterns formed by the electrode wiring pattern column 15a can be interpolated by a plurality of exposure patterns formed by the electrode wiring pattern columns 15b, 15c, and 15d following the electrode wiring pattern column 15a.

Figure 3:
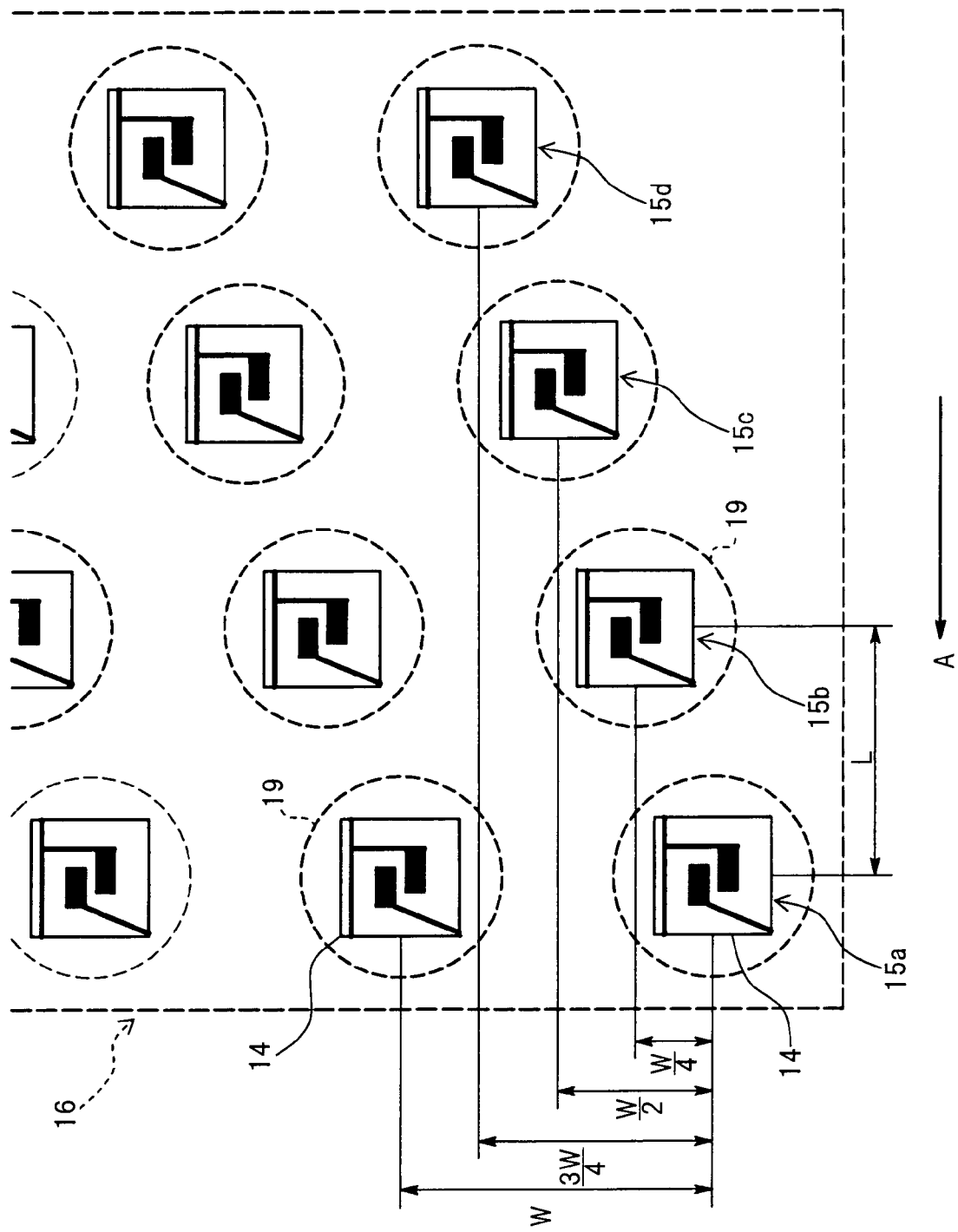
FIG. 3 is an enlarged plan view illustrating a first mask pattern group of the photomask.

In this embodiment, as illustrated in FIG. 3, in the photomask 3, when the plurality of electrode wiring patterns 14 of the electrode wiring pattern columns 15a to 15d are formed by a W pitch, the second, the third, and the fourth electrode wiring pattern columns 15b, 15c, and 15d following the first electrode wiring pattern column 15a located at the most downstream side in the conveying direction (direction indicated by the arrow A) are formed by being shifted by W/n (n is an integer) respectively with respect to an adjacent electrode wiring pattern column 15 in the arrangement direction of the electrode wiring patterns 14 of the electrode wiring pattern columns 15 (a direction substantially perpendicular to the arrow A), and the first to the fourth electrode wiring pattern columns 15a to 15d are formed in parallel with each other by an arrangement pitch L. In FIG. 3, a specific example is illustrated in which the second, the third, and the fourth electrode wiring pattern columns 15b, 15c, and 15d are formed by being shifted by W/4, W/2, and 3W/4 respectively with respect to the first electrode wiring pattern column 15a. The arrangement pitch L is the same as an arrangement pitch of thin film transistor forming portions in the TFT substrate 8 in the direction indicated by the arrow A.

Figure 4:
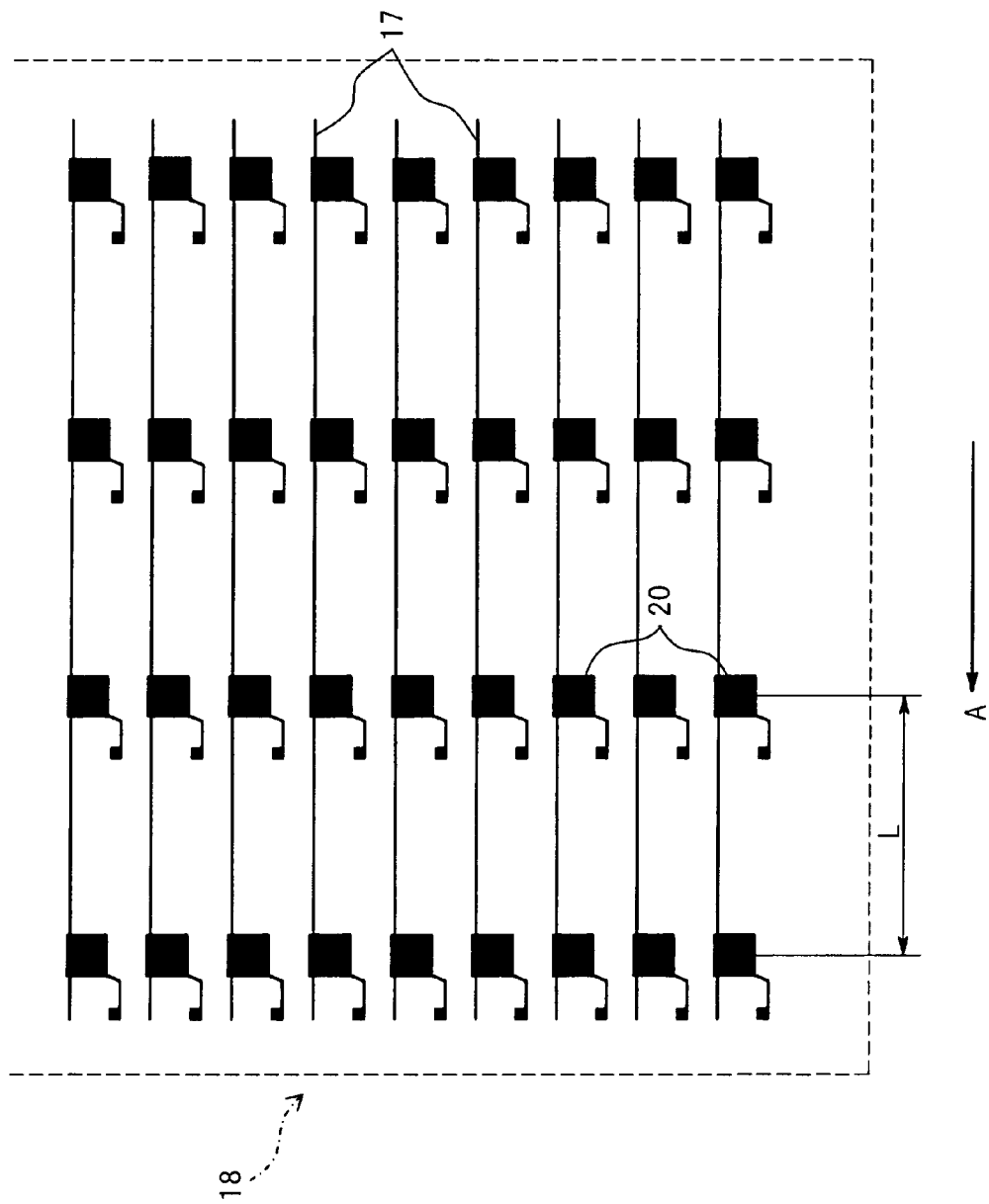
FIG. 4 is an enlarged plan view illustrating a second mask pattern group of the photomask.

As illustrated in FIG. 2A, on the upstream side of the electrode wiring pattern group 16 in the conveying direction of the TFT substrate 8 (direction indicated by the arrow A), the signal wiring pattern group 18 including a plurality of signal wiring patterns 17 illustrated in FIG. 4 is formed apart from the electrode wiring pattern group 16 by a distance mL (m is an integer). In FIG. 4, reference numeral 20 denotes a portion corresponding to a thin film transistor forming portion in the TFT substrate 8. The signal wiring patterns 17 are formed so that the portions 20 and the electrode wiring patterns 14 illustrated in FIG. 3 are overlapped and exposed by moving the TFT substrate 8 in the direction indicated by the arrow A.

Furthermore, as illustrated in FIG. 2A, on the chrome (Cr) film 13 of the photomask 3, an elongated opening is formed in substantially parallel with the electrode wiring pattern column 15 apart from the first electrode wiring pattern column 15a by a distance D on one side of the pattern forming area 10. The opening is to be the observing window 11 that enables observation of the surface of the TFT substrate 8 by the imaging device 5 described below.

As illustrated in FIG. 1, the photomask 3 is positioned and fixed on the mask stage 2 with the micro-lenses 19 facing the TFT substrate 8 and the observation window 11 being on the upstream side in the conveying direction of the TFT substrate 8 (in the direction indicated by the arrow A).

The exposure optical system 4 is formed above the mask stage 2. The exposure optical system 4 irradiates uniform light 24 from a light source to the photomask 3. The exposure optical system 4 includes a light source 21, a rod lens 22, and a condenser lens 23.

The light source 21 irradiates, for example, ultraviolet light of 355 nm. The light source 21 is, for example, a flash lamp, an ultraviolet irradiating laser light source, or the like whose light emission is controlled by the control device 7 described below. The rod lens 22 is provided in front in an irradiating direction of the light 24 emitted from the light source 21, and equalizes brightness distribution of the light 24 from the light source in a cross-section perpendicular to the optical axis of the light 24 from the light source. An optical component for equalizing the brightness distribution of the light 24 from the light source is not limited to the rod lens 22, but it is possible to use a known optical component such as a light pipe, or a fly eye lens. The condenser lens 23 is provided so that the anterior focal point of the condenser lens 23 matches an output end 22a of the rod lens 22. The condenser lens 23 converts the light 24 emitted from the rod lens 22 into parallel light and irradiates the parallel light to the photomask 3.

The imaging device 5 is provided on the upstream side of the exposure optical system 4 in the conveying direction of the TFT substrate 8 indicated by the arrow A. The imaging device 5 simultaneously captures images of a positioning reference formed on the TFT substrate 8, for example, a reference position of the thin film transistor forming portions and a reference mark formed in the observation window 11 of the photomask 3 at a position on the upstream side of the exposure position of the photomask 3 in the conveying direction. The imaging means 5 is a line camera in which photosensitive elements are linearly aligned in a direction substantially perpendicular to the conveying direction of the TFT substrate 8 (the direction indicated by the arrow A) in a plane in parallel with the upper surface of the stage 9, and disposed so that the longitudinal central axis of the imaging device 5 corresponds to the longitudinal central axis of the observation window 11 of the photomask 3. In FIG. 1, reference numeral 25 denotes a total reflection mirror for bending a light path of the imaging means 5.

The illumination device 6 is provided below the stage 9 of the conveying device 1 corresponding to the imaging area of the imaging device 5. The illumination device 6 irradiates illumination light of visual light from which ultraviolet light is eliminated to the TFT substrate 8 from below, so that the imaging device 5 can observe the thin film transistor forming portions formed on the surface of the TFT substrate 8. The illumination device 6 is, for example, a halogen lamp. The illumination device 6 may be an epi-illumination, which is provided above the stage 9.

Figure 5:
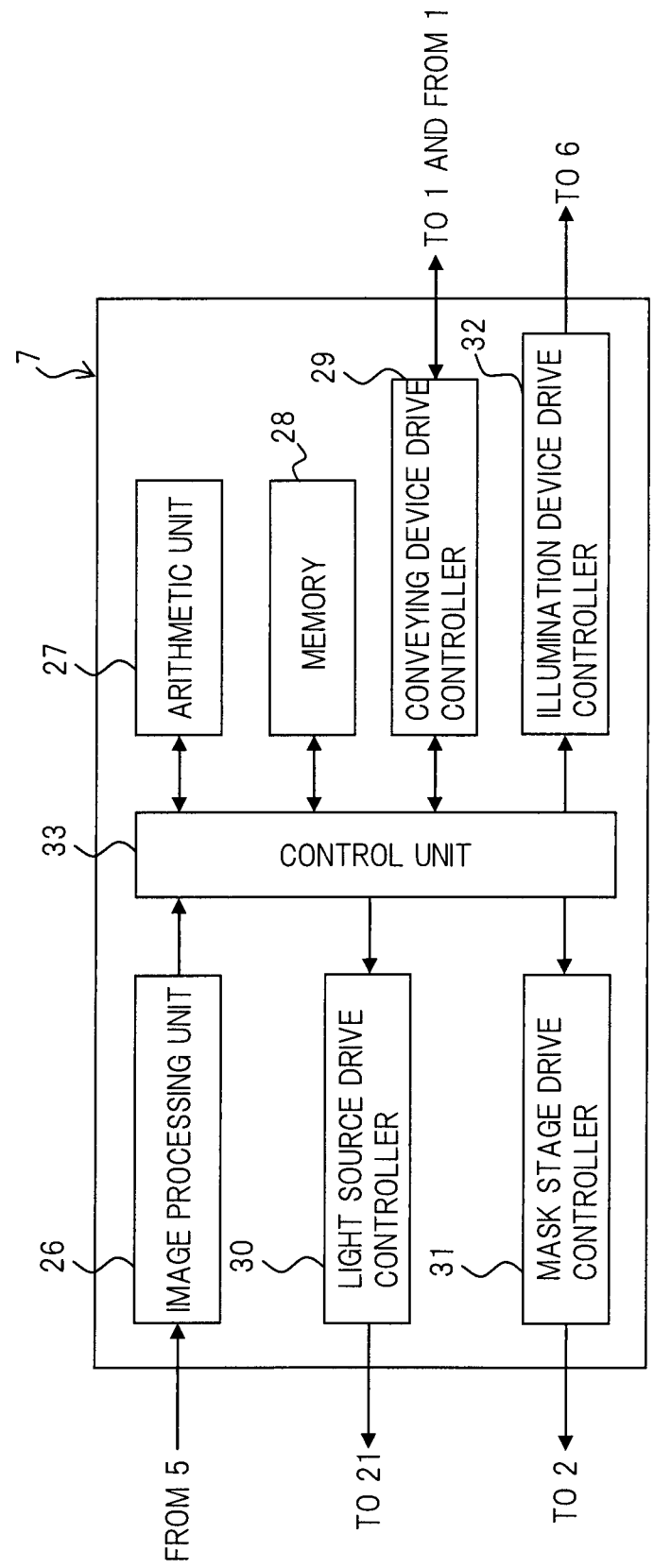
FIG. 5 is a block diagram illustrating a configuration of a control device of the exposure apparatus.

The control device 7 is provided and connected to the conveying device 1, the imaging device 5, the light source 21, the mask stage 2, and the illumination device 6. The control device 7 intermittently irradiates exposure light 34 to the TFT substrate 8 through the photomask 3 while conveying the TFT substrate 8 in one direction, reduces and projects a plurality of electrode wiring patterns 14 of the photomask 3 so that the electrode wiring patterns 14 overlap a plurality of thin film transistor forming portions formed on the TFT substrate 8 respectively, and controls exposure timing so that exposure patterns of a plurality of signal wiring patterns 17 are connected to exposure patterns of the electrode wiring patterns 14. As illustrated in FIG. 5, the control device 7 includes an image processing unit 26, an arithmetic unit 27, a memory 28, a conveying device drive controller 29, a light source drive controller 30, a mask stage drive controller 31, an illumination device drive controller 32, and a control unit 33.

The image processing unit 26 performs image processing on captured images of the surface of the TFT substrate 8 and the reference mark of the photomask 3 obtained by the imaging device 5, and detects the reference position set in advance in the thin film transistor forming portions on the TFT substrate 8 and the position of the reference mark of the photomask 3.

The arithmetic unit 27 calculates a distance between the reference position on the TFT substrate 8 and the reference mark of the photomask 3 detected by the image processing unit 26, compares the result of the calculation with a target value stored in the memory 28 described below, outputs the difference obtained by the comparison to the mask stage drive controller 31 as a correction value, calculates a moving distance of the stage 9 by inputting an output of the position sensor of the conveying device 1, compares the calculation result with the arrangement pitch L of the thin film transistor forming portions on the TFT substrate 8 in the direction indicated by the arrow A (the conveying direction) stored in the memory 28, and outputs a lighting instruction for lighting the light source 21 to the light source drive controller 30 every time the stage 9 moves by the distance L.

The memory 28 temporarily stores the calculation results of the arithmetic unit 27 and stores a moving speed V of the stage 9, the target value of the distance between the reference position on the TFT substrate 8 and the reference mark of the photomask 3, and other initial setting values.

The conveying device drive controller 29 moves the stage 9 of the conveying device 1 at a constant speed in the direction indicated by the arrow A. The conveying device drive controller 29 inputs an output of the speed sensor of the conveying device 1, compares the output with the moving speed V stored in the memory 28, and controls the drive of the conveying device 1 so that the output matches the moving speed V.

The light source drive controller 30 intermittently lights the light source 21. The light source drive controller 30 transmits a drive signal to the light source 21 in accordance with the lighting instruction input from the arithmetic unit 27.

The mask stage drive controller 31 moves the mask stage 2 integrally with the imaging device 5 in a direction substantially perpendicular to the conveying direction shown by the arrow A in a plane in parallel with the surface of the stage 9. The mask stage drive controller 31 controls the movement of the mask stage 2 on the basis of the correction value input from the arithmetic unit 27.

The illumination means drive controller 32 lights up and lights off the illumination device 6. The illumination means drive controller 32 controls so that the illumination device 6 is lighted up when an exposure start switch is turned on and the illumination means 6 is lighted off when all exposures of the TFT substrate 8 are completed. The control unit 33 performs controls for mediating between each constituent element so that the constituent elements are appropriately driven.

Next, an operation of the exposure apparatus configured as described above will be described.

First, for example, by operating an operation means not shown in the figures including a keyboard and the like, a moving speed V of the stage 9, a moving distance of the stage 9 from when the exposure is started to when the exposure is completed, a power and a light emitting time period of the light source 21, a distance D between the first electrode wiring pattern column 15a of the photomask 3 and the observation window 11, an arrangement pitch L of the thin film transistor forming portions formed on the TFT substrate 8 in the direction indicated by the arrow A (the conveying direction), a target value of the distance between the reference position set in advance in the thin film transistor forming portions on the TFT substrate 8 and the reference mark formed on the photomask 3, and the like are input and stored in the memory 28, and then initial setting is performed.

Next, the TFT substrate 8, on the surface of which a photosensitive resin (for example, positive resist) is coated, is positioned and mounted at a predetermine position on the stage 9 with the coated surface facing up. When the exposure start switch not shown in the figures is turned on, the control device 7 starts the conveying device drive controller 29 and moves the stage 9 at the speed V in the direction indicated by the arrow A. In this case, the conveying device drive controller 29 inputs an output of the speed sensor of the conveying device 1, compares the output with the moving speed V stored in the memory 28, and controls the drive of the conveying device 1 so that the moving speed of the stage 9 becomes V. When the exposure start switch is turned on, the control device 7 starts the illumination device drive controller 32 and lights up the illumination device 6. At the same time, the control device 7 starts the imaging device 5 and starts imaging.

The TFT substrate 8 is conveyed following the move of the stage 9, and when the thin film transistor forming portions located at the most downstream side in the conveying direction (direction indicated by the arrow A) among the thin film transistor forming portions formed on the TFT substrate 8 reach the imaging area of the imaging device 5, the imaging device 5 captures an image of the thin film transistor forming portions through the observation window 11 of the photomask 3, and at the same time, captures an image of the reference mark of the photomask 3. Then, the imaging device 5 outputs an electrical signal of the captured images to the image processing unit 26 of the control device 7.

The image processing unit 26 performs image processing on the electrical signal of the captured images input from the imaging device 5, detects the reference position set in advance in the thin film transistor forming portions on the TFT substrate 8 and the position of the reference mark of the photomask 3, and outputs the position data thereof to the arithmetic unit 27.

The arithmetic unit 27 calculates the distance between the reference position and the reference mark on the basis of the position data of the reference position and the position data of the reference mark of the photomask 3 input from the image processing unit 26, compares the calculated distance with the target value of the distance between the reference position and the reference mark read from the memory 28, and outputs the difference obtained by the comparison to the mask stage drive controller 31 as a correction value.

The mask stage drive controller 31 moves the mask stage 2 by the correction value input from the arithmetic unit 27 in a direction substantially perpendicular to the direction shown by the arrow A (conveying direction) in a plane in parallel with the surface of the stage 9, and achieves alignment of the TFT substrate 8 with the photomask 3. This operation is performed at all times during the exposure operation of the entire surface of the TFT substrate 8, and a position error of the TFT substrate 8 due to yawing in a direction perpendicular to the direction indicated by the arrow A can be suppressed.

When the image processing unit 26 performs image processing on the electrical signal of the captured images input from the imaging device 5 and the thin film transistor forming portions located at the most downstream side in the conveying direction of the TFT substrate 8 (the direction indicated by the arrow A) are detected, the arithmetic unit 27 calculates a distance by which the stage 9 moves from when the thin film transistor forming portions are detected on the basis of the output of the position sensor of the conveying device 1 and compares the calculated distance with the distance D between the first electrode wiring pattern column 15a of the photomask 3 and the observation window 11 stored in the memory 28. When the distance by which the stage 9 moves matches the distance D, the arithmetic unit 27 outputs a lighting instruction for lighting the light source 21 to the light source drive controller 30. The light source drive controller 30 outputs a drive signal to the light source 21 in accordance with the lighting instruction. In this way, the light source 21 is lighted by a predetermined power for a predetermined time period in accordance with the initial setting values.

The brightness distribution of the ultraviolet light 24 emitted from the light source 21 is equalized by the rod lens 22, and then the ultraviolet light 24 from the light source is converted into parallel light and irradiated to the photomask 3. The exposure light 34 that passes through the photomask 3 is collected on the TFT substrate 8 by the micro-lenses 19, so that the exposure light 34 reduces and projects the electrode wiring patterns 14 of the photomask 3 illustrated in FIG. 3 and forms exposure patterns 35 corresponding to the electrode wiring patterns 14 (see FIG. 6). At the same time, the exposure light 34 forms exposure patterns 36 corresponding to the signal wiring patterns 17 illustrated in FIG. 4 (see FIG. 6).

Furthermore, the arithmetic unit 27 compares the distance by which the stage 9 moves obtained on the basis of the output of the position sensor of the conveying device 1 with the arrangement pitch L of the thin film transistor forming portions formed on the TFT substrate 8 in the direction indicated by the arrow A (the conveying direction) among the initial setting values stored in the memory 28, and when the distance and the arrangement pitch L match each other, the arithmetic unit 27 outputs a lighting instruction for lighting the light source 21 to the light source drive controller 30. In this way, the light source 21 is lighted by a predetermined power for a predetermined time period in accordance with the initial setting values.

Figure 6:
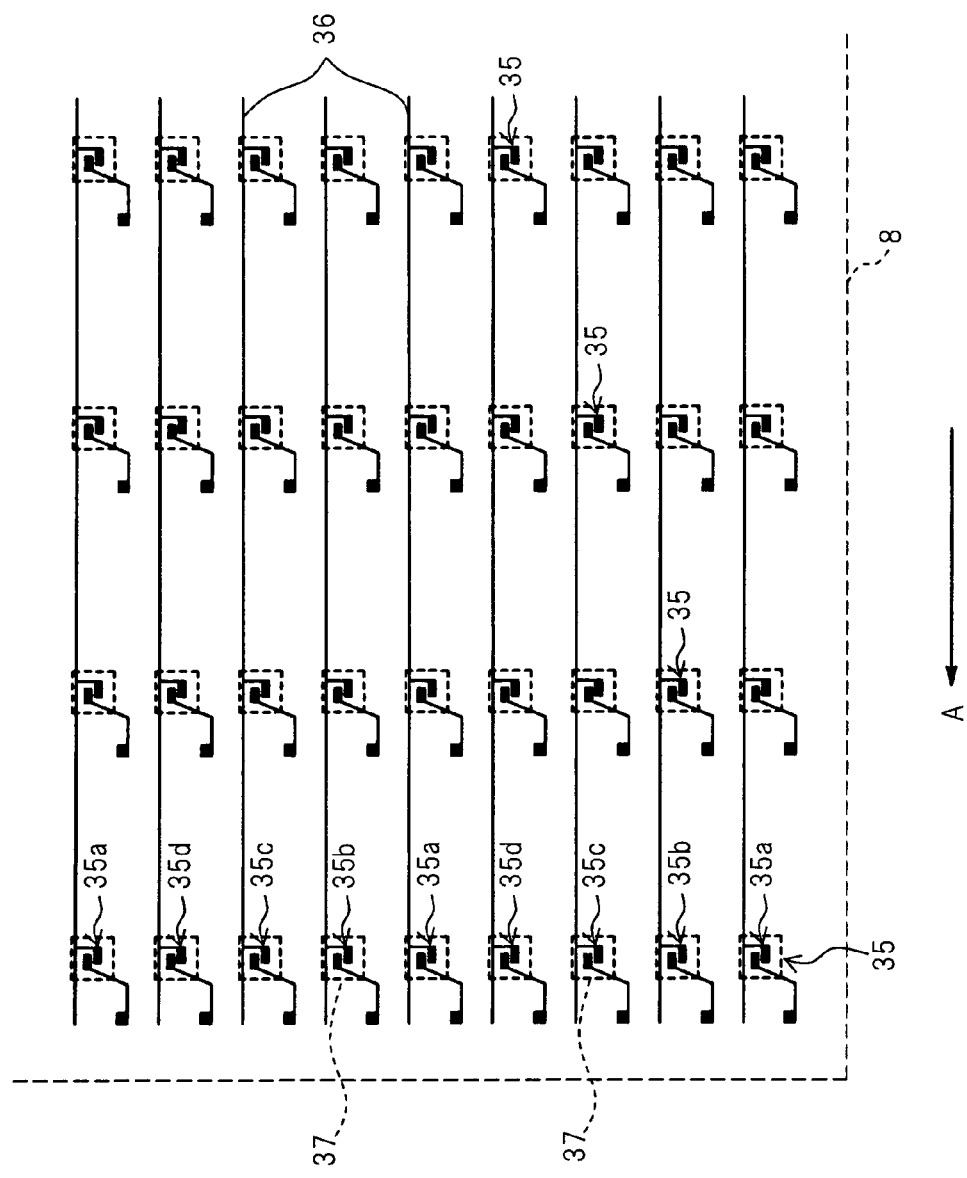
FIG. 6 is a plan view illustrating an exposure pattern which is formed on a subject to be exposed by using the photomask.

The ultraviolet light 24 emitted from the light source 21 is irradiated to the photomask 3 in the same manner as described above. The exposure light 34 that passes through the photomask 3 forms the exposure patterns 35 and 36 of the electrode wiring patterns 14 and the signal wiring patterns 17 of the photomask 3 on the TFT substrate 8 in the same manner as described above. Thereafter, every time the stage 9 moves by the distance L, the light source 21 emits light for a predetermined time period and the exposure patterns 35 and 36 are formed. In this way, as illustrated in FIG. 6, intervals between a plurality of exposure patterns 35a corresponding to a plurality of electrode wiring patterns 14 of the first electrode wiring pattern column 15a located at the most downstream side in the conveying direction of the TFT substrate 8 (the direction indicated by the arrow A) can be interpolated by a plurality of exposure patterns 35b, 35c, and 35d corresponding to the electrode wiring patterns 14 of the second to the fourth electrode wiring pattern columns 15b to 15d following the first electrode wiring pattern column 15a to form the exposure patterns 35, and the exposure patterns 36 corresponding to the signal wiring patterns 17 can be formed on the entire surface of the TFT substrate 8. In this case, in the thin film transistor forming portions 37, the exposure patterns 35 of the electrode wiring patterns 14 are overlapped with the exposure patterns 36 of the signal wiring patterns 17 and exposed. However, the portions 20 corresponding to the thin film transistor forming portions 37 in the signal wiring patterns 17 are light-shielded by the chrome (Cr) film 13, so that only the exposure patterns 35 of the electrode wiring patterns 14 are formed on the thin film transistor forming portions 37. Therefore, as illustrated in FIG. 6, the exposure patterns 35 of the electrode wiring patterns 14 can be formed in a state in which the exposure patterns 35 are connected to the exposure patterns 36 of the signal wiring patterns 17.

The arrangement order of the first to the fourth electrode wiring pattern columns 15a to 15d is not limited to that described above, but may be arbitrarily changed.

In the above embodiment, although a case is described in which, in the photomask 3, a plurality of electrode wiring patterns 14 is formed on one surface 12a of the transparent substrate 12 and a plurality of micro-lenses 19 is formed on the other surface 12b of the transparent substrate 12, the present invention is not limited to this, but the photomask 3 may be formed by overlapping a mask substrate on the surface of which a plurality of electrode wiring patterns 14 and a plurality of signal wiring patterns 17 are formed and a lens substrate on the surface of which a plurality of micro-lenses 19 is formed so that the plurality of electrode wiring patterns 14 and the plurality of micro-lenses 19 correspond to each other.

Although, in the above description, a case in which the subject to be exposed is the TFT substrate 8 is described, the present invention is not limited to this, but the present invention can be applied to any substrate to be formed in a state in which two types of mask patterns requiring different resolutions coexist.

It should be noted that the entire contents of Japanese Patent Application No. 2008-273863, filed on Oct. 24, 2008, on which the convention priority is claimed is incorporated herein by reference.

It should also be understood that many modifications and variations of the described embodiments of the invention will occur to a person having an ordinary skill in the art without departing from the spirit and scope of the present invention as claimed in the appended claims.

What is claimed is:

1. An exposure apparatus, comprising:
   a conveying device that conveys a subject to be exposed in one direction;
   a photomask on which a plurality of mask patterns are formed, wherein two mask pattern groups formed by two types of mask patterns requiring different resolutions are formed on a light shielding film formed on one surface of a transparent substrate in front and back of the conveying direction of the subject to be exposed, wherein micro-lenses that reduce and project one mask pattern requiring a high resolution among the two types of mask patterns requiring different resolutions onto the subject to be exposed are formed on the other surface of the transparent substrate in a position corresponding to the one mask pattern requiring a high resolution, and wherein the photomask is disposed so that the micro-lenses face the subject to be exposed; and
   a light source that intermittently irradiates light to the photomask to thereby form an exposure pattern on the subject to be exposed corresponding to the plurality of mask patterns formed on the photomask, while conveying the subject to be exposed in one direction.

2. The exposure apparatus according to claim 1, wherein the mask pattern group formed by one mask pattern requiring a high resolution includes a plurality of mask pattern columns formed by linearly arranging a plurality of the mask patterns at a predetermined pitch in a direction substantially perpendicular to the conveying direction of the subject to be exposed, and the mask pattern group is formed by shifting mask pattern columns following a mask pattern column located at the most downstream side in the conveying direction of the subject to be exposed by a predetermined length respectively in the arrangement direction of the plurality of mask patterns so that intervals between a plurality of exposure patterns formed by the mask pattern column located at the most downstream side are able to be interpolated by a plurality of exposure patterns formed by the mask pattern columns following the mask pattern column located at the most downstream side.

3. The exposure apparatus according to claim 2, wherein
   the subject to be exposed is a TFT substrate of a liquid crystal display apparatus,
   among the two types of mask patterns requiring different resolutions, the one mask pattern is an electrode wiring pattern of a thin film transistor, and the other mask pattern is a signal wiring pattern for providing a signal to the thin film transistor, and
   the electrode wiring pattern and the signal wiring pattern are formed so that an exposure pattern of the electrode wiring pattern and an exposure pattern of the signal wiring pattern are connected to each other.

4. A photomask, comprising:
   two mask pattern groups formed by two types of mask patterns requiring different resolutions, the mask pattern groups being formed abreast on a light shielding film formed on one surface of a transparent substrate; and
   micro-lenses that reduce and project one mask pattern requiring a high resolution among the two types of mask patterns requiring different resolutions onto a subject to be exposed which is disposed to face the micro-lenses are formed on the other surface of the transparent substrate in a position corresponding to the one mask pattern requiring a high resolution.

5. The photomask according to claim 4, wherein the mask pattern group formed by one mask pattern requiring a high resolution includes a plurality of mask pattern columns which is formed by linearly arranging a plurality of the mask patterns at a predetermined pitch, and which is formed by, with respect to an arbitrary mask pattern column, shifting the other mask pattern columns by a predetermined length respectively in the arrangement direction of the plurality of the mask patterns.

* * * * *